United States Patent [19]
Tsukada

[11] 4,023,055
[45] May 10, 1977

[54] MOUNTING DEVICE FOR A QUARTZ TUNING FORK

[75] Inventor: Nobuo Tsukada, Tokyo, Japan

[73] Assignee: Kabushiki Kaisha Daini Seikosha, Japan

[22] Filed: Mar. 17, 1975

[21] Appl. No.: 559,237

[30] Foreign Application Priority Data

Mar. 15, 1974 Japan .............................. 49-29741

[52] U.S. Cl. ............................................. 310/9.1
[51] Int. Cl.² .................................... H01L 41/04
[58] Field of Search ............. 310/8.2, 8.5, 8.6, 9.1, 310/9.6, 9.4, 25; 58/23 TF

[56] References Cited

UNITED STATES PATENTS

| | | | |
|---|---|---|---|
| 3,106,124 | 10/1963 | Asten | 310/25 X |
| 3,308,361 | 3/1967 | Nakai et al. | 310/25 X |
| 3,310,757 | 3/1967 | Dostal | 310/25 X |
| 3,795,831 | 3/1974 | Fujita | 310/8.2 X |
| 3,805,509 | 4/1974 | Assmus et al. | 310/9.1 X |
| 3,909,639 | 9/1975 | Kawai et al. | 310/9.4 X |
| 3,909,640 | 9/1975 | Kawai | 310/9.4 X |

Primary Examiner—Mark O. Budd
Attorney, Agent, or Firm—Robert E. Burns; Emmanuel J. Lobato; Bruce L. Adams

[57] ABSTRACT

A quartz vibrator device comprises a quartz element of the tuning fork type, a supporting spring member for supporting the quartz element, a pedestal on which is mounted the supporting spring member and a protective casing in which is mounted the quartz element. One end portion of said supporting spring member supports one end portion of said quartz element and has at least two separate U-shaped spring portions, the other end portion of said spring member being fixed to said pedestal portion of said casing. The U-shaped portions extend past the center of gravity of said quartz element, whereby said spring member has the same flexure angle between one spring section of said spring member and other spring section of said spring member at the center of gravity of said quartz element.

7 Claims, 5 Drawing Figures

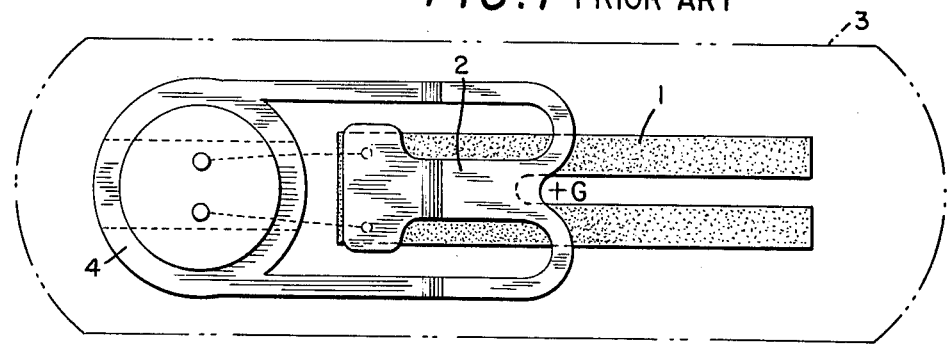
FIG. 1 PRIOR ART
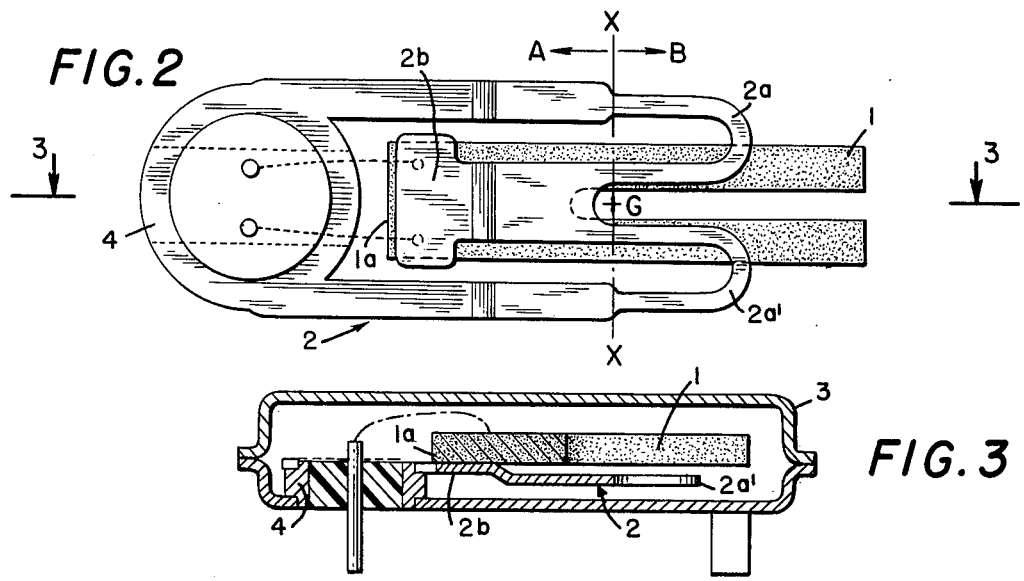
FIG. 2
FIG. 3
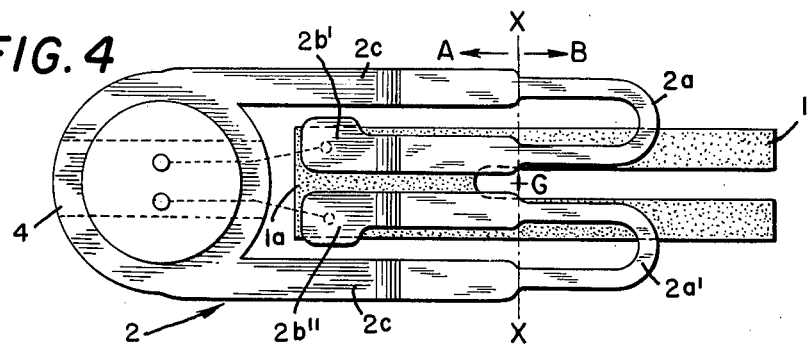
FIG. 4
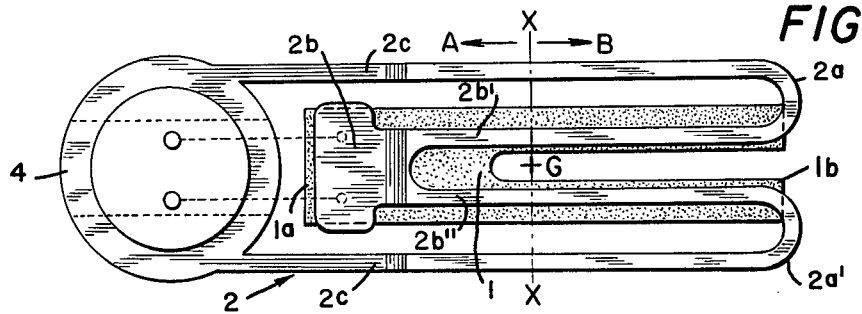
FIG. 5

MOUNTING DEVICE FOR A QUARTZ TUNING FORK

BACKGROUND OF THE INVENTION

This invention relates to a quartz vibrator device having a spring member which having at least two U-shaped spring portions for supporting the quartz vibrator, said U-shaped spring portions are elongated to end portion of said quartz the center of gravity point of said quartz element.

In the conventional type of quartz vibrator device, there have been proposed various constructions to protect the quartz element from outer or external shock. One example of the conventional construction is shown in FIG. 1 which depicts, one end of a supporting spring 2 for supporting a quartz element fixed on a base end of a quartz oscillator 1 of the tuning fork type. The other end of said spring 2 is divided into two parts. The divided two parts of the spring 2 slightly extend inwardly and then are shaped into two U-shaped parts about a center of gravity G of said quartz element. The external end portion of said spring member 2 is fixed on a pedestal portion 4 which is mounted in a protective casing 3. In this manner, though it is obtained such a merit that the width of the divided spring is uniform and the flexure volume of the spring is small at a contact portion where the quartz element is constructed with the supporting spring member, it is inevitable that the quartz element tends to touch the inner surface of the protective casing because the end of the quartz element flexes largely in respone to a little flexure angle of the spring member about the contact portion. Therefore, to avoid the this drawback, the length of the spring member has been shortened or the width thereof has been increased. However, the elastic energy stored in the spring is accordingly decreased so that the oscillator is disadvantageously supported.

These attempts are not advantageous for the spring 2 which loses a positive strength even if the flexibility thereof is improved.

Therefore it is difficult to assure both effects that the quartz element is made as small in size as possible and that it is protected from external shock.

OBJECT OF THE INVENTION

The present invention aims at eliminating the above noted difficulty and insufficiency, and therefore it is the primary object of the present invention to provide an elastically supporting construction for supporting a quartz element without the quartz touching a protective casing by using an improved spring member for mounting the quartz element and which is formed so as to decrease the maximum flexure volume thereof without decreasing the elastic energy which is stored therein.

SUMMARY OF THE INVENTION

According to the present invention, there is provided a quartz vibrator device including a quartz element of the tuning fork type, a supporting spring member for supporting the quartz element, a pedestal and a protective casing for mounting the quartz element. One end portion of said supporting spring member is affixed to a base end portion of said quartz element and has at least two divided spring portions, the other end portion of said spring member which being fixed to said pedestal portion of said protective casing, The two divided spring portions of said supporting spring member, are shaped as U-shaped portions respectively, which are elongated and extend a predetermined distance past the center of gravity of said quartz element, whereby said spring member has the same flexure angle between one spring section thereof and the other spring section at the location of the center of gravity of said quartz element.

BRIEF DESCRIPTION OF THE DRAWINGS

The above mentioned and further object, features and advantages of the present invention will become more obvious from the following description when taken in connection with the accompanying drawings, which show preferred embodiments of the invention, and wherein:

FIG. 1 is a back or rear plan view showing a conventional embodiment of a support construction of a quartz vibrator of the present invention, FIG. 2 is a back or rear plan view showing a support construction of a quartz vibrator of the present invention.

FIG. 3 is a side elevational view taken along the line 3—3 of an embodiment of the present invention shown in FIG. 2.

FIG. 4 and FIG. 5 are back or rear plan views showing other embodiments of the present invention.

DETAILED DESCRIPTION OF THE INVENTION

Referring now to the accompanying drawing, the embodiment of this invention is explained and this embodiment directed to a quartz vibrator device in FIG. 2 and FIG. 3, there is shown an elastically supporting construction of a quartz vibrator according to the present invention.

In FIG. 2, a quartz element 1 is elastically supported by means of a supporting spring member 2, said supporting spring member 2 being uniquely formed such that the overall length of said support spring member 2 is increased in comparison to the conventional type. Said supporting spring member 2 is divided into two portions about a center of gravity point G of said quartz element 1 and the two portions extend toward the right end portion of the quartz element (as viewed in FIG. 2) and extend over said center of gravity point G. Then, the divided two portions are respectively shaped to U-shaped portions 2a and 2a in which the end portions of the inner legs are integral with a are shaped to body portions 2b at the left end portion of the quartz element. The body portion 2b supports the end portion 1a of said quartz element 1.

It is to be noted that a width of said U-shaped portions 2a and 2a are different from and less that of the base portion of said supporting spring member 2 which is mounted to a pedestral portion 4 of said protective casing 3.

Referring to another embodiment which is shown in FIG. 4, the quartz element 1 is elastically supported by means of a supporting spring member 2, said supporting spring member 2 being uniquely formed and having an overall length which is increased in comparison to the conventional type. Said supporting spring member 2 is divided about a center of gravity poing G of said quartz element 1 into two portions 2a and 2a which extend rightwardly (as viewed in FIG. 4) over the center of gravity point G.

Then, said divided two portions are respectively shaped to U-shaped portions, the end portions of said the inner leap of said U-shaped portions 2a and 2a are respectively attached to a left end portion 1a of the quartz element (as viewed in FIG. 4,) said inner legs terminating in end portions 2b' and 2b which support the end portion of said quartz element 1.

It is to be noted that the width of said U-shaped portions 2a and 2a' is different from and less than that of the base portion 2c of said supporting spring member. The base portion 2c is mounted to a pedestal portion 4 which is incased in a protective casing 3.

Referring to another embodiment of the invention shown in FIG. 5, the quartz element 1 is elastically supported by means of a supporting spring member 2, said supporting spring member 2 being uniquely formed and having an overall length which is increased in comparison to the conventional type.

Said supporting spring member 2 is divided about a center of gravity point G of said quartz element 1 into two portions 2a and 2a' which extend over the right end portion 1b of the quartz element 1 and extend will past the center of gravity point G.

Then, said divided two portions are respectively shaped to U-shaped portions 2a and 2a' having inner leg portions 2b' and 2b' respectively which are shaped to one body portion 2b located at the left end portion 1a of the quartz element 1 (as viewed in FIG. 5). The one body portion 2b contacts and supports the end portion 1a of said quartz element 1.

Further, the width of said supporting spring member 2 is uniform from base portions 2c to the inner end portions 2b' and 2b''. It is appreciated that the supporting spring member 2 has substantially the same flexure angle between right and left sections A and B about the center of gravity point G of said quartz element 1.

As will be clear from the above description the left section A and the right section B of said supporting spring member 2 are parted by an imaginary vertical line X—X passing through the center of said center of gravity point G of the quartz element 1. Therefore a moment of said A section is actuated in orientation for lowering the end portion 1b of said quartz element 1, while a moment of said B section is actuated in the reverse orientation to said A section.

Therefore, by adjusting the width and length of these portions of said supporting spring member 2, the moving amounts of the mounting portion and the other portions of said supporting spring member 2 are respectively the same distances, whereby it is possible to obtain a condition in which the whole of the quartz element vibrates horizontally.

Therefore, it may be assumed the flexure angle of the supporting spring member which supports the quartz element becomes zero due to the condition mentioned above.

Accordingly, since the supporting spring member for mounting or supporting the quartz element has a flexure volume which is kept down in maximum and a total flexure angle is zero, the elastic energy which is stored in said supporting spring member is not decreased.

As a result, the value of the maximum flexure of the quartz element and the elastic effect of said supporting spring member are decreased as compared with conventional supporting spring members, so that the shock resistance is effectively increased.

Further, as to the length of the supporting spring member, the left section A is longer than the right section B as shown in FIG. 2 and 4.

Therefore, even if the length of the right section B of said supporting spring member is short, the spring has a large flexure effect in an inverse direction, whereby a the overall size may be miniaturized because a large space is not required.

What we claimed is:

1. A quartz vibrator device comprising, in combination: a quartz element of the tuning fork type; a supporting spring member connected to and supporting said quartz element; and means including a pedestal and a protective casing jointly mounting said supporting spring member thereby mounting said quartz element; said supporting spring member having at one end portion at least two divided U-shaped portions with one end portion of said U-shaped portions supporting one end portion of said quartz element, the other end portion of said supporting spring member being fixed to said pedestal, said U-shaped portions being elongated and extending along said quartz element beyond center of gravity point of said quartz element.

2. A quartz vibrator device as claimed in claim 1; wherein said one end portions of said U-shaped portions are connected as one body.

3. A quartz vibrator device as claimed in claim 1; wherein said one end portions of said U-shaped portions are separated.

4. A quartz vibrator device comprising: a protective casing; a quartz element of the tuning fork type disposed within said protective casing and comprising a base and a plurality of vibratable legs extending outwardly from said base and having a given center of gravity point; and means mounting said quartz element within said protective casing, said means comprising a pedestal connected to said protective casing and projecting interiorly thereof, and a supporting spring member having two end portions, one end portion being connected to said pedestal to thereby mount said supporting spring member, and the other end portion being divided into two generally elongated U-shaped portions which extend in the direction of said quartz element vibratable legs to a location beyond said center of gravity point and which extend in the other direction toward said quartz element base and terminating in a body portion affixed to said base to thereby support said quartz element.

5. A quartz vibrator device according to claim 4; wherein said body portion is configured as one part connected to the ends of both U-shaped portions.

6. A quartz vibrator device according to claim 4; wherein said body portion is configured as two separate parts each connected to the end of one of said two U-shaped portions.

7. A quartz vibrator device according to claim 4; wherein said U-shaped portions have portions of narrower width than that of the other portions of said supporting spring member.

* * * * *